United States Patent
Li et al.

(10) Patent No.: US 7,466,613 B2
(45) Date of Patent: Dec. 16, 2008

(54) SENSE AMPLIFIER FOR FLASH MEMORY DEVICE

(75) Inventors: Kris X. Li, Cupertino, CA (US); Jason Guo, San Jose, CA (US); Edward S. Hui, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 120 days.

(21) Appl. No.: 11/107,466

(22) Filed: Apr. 15, 2005

(65) Prior Publication Data

US 2006/0232303 A1  Oct. 19, 2006

(51) Int. Cl.
*G11C 7/00* (2006.01)

(52) U.S. Cl. .................. 365/205; 365/207; 365/230.08; 365/189.05

(58) Field of Classification Search .................. 365/205, 365/207, 230.08, 189.05
See application file for complete search history.

(56) References Cited

U.S. PATENT DOCUMENTS

| 5,524,094 | A | * | 6/1996 | Nobukata et al. ...... 365/185.21 |
| 5,677,886 | A | * | 10/1997 | Seo et al. ..................... 365/203 |
| 5,903,171 | A | | 5/1999 | Shieh ........................... 327/55 |
| 5,973,957 | A | * | 10/1999 | Tedrow ................. 365/185.03 |
| 6,141,259 | A | * | 10/2000 | Scott et al. ............. 365/189.06 |
| 6,363,023 | B2 | | 3/2002 | Anderson et al. ........... 365/207 |
| 7,245,549 | B2 | * | 7/2007 | Komura et al. ......... 365/230.03 |
| 2002/0036940 | A1 | | 3/2002 | Uchikoba et al. .......... 365/205 |
| 2003/0002315 | A1 | | 1/2003 | Ooishi .......................... 365/63 |
| 2003/0142568 | A1 | | 7/2003 | Giove et al. ................ 365/207 |
| 2004/0004881 | A1 | | 1/2004 | Sahoo ......................... 365/208 |
| 2004/0136253 | A1 | | 7/2004 | Gupta et al. ................ 365/205 |
| 2006/0056226 | A1 | * | 3/2006 | Lin et al. .................... 365/145 |

* cited by examiner

*Primary Examiner*—Connie C Yoha
(74) *Attorney, Agent, or Firm*—Schwegman, Lundberg & Woessner, P.A.

(57) ABSTRACT

A sense amplifier circuit comprises first and second cross-coupled inverters to produce a latch with first and second power supply nodes. The first latch power supply node couples a first power supply potential to the latch when the sense amplifier is operating in a read-out mode. The second latch power supply node couples a second power supply potential to the latch when the sense amplifier operates in the read-out mode. The first and second latch power supply nodes are further configured to couple an equalization potential to the first and second power supply nodes when the latch is operating in an equalization mode.

23 Claims, 3 Drawing Sheets

Fig. _1

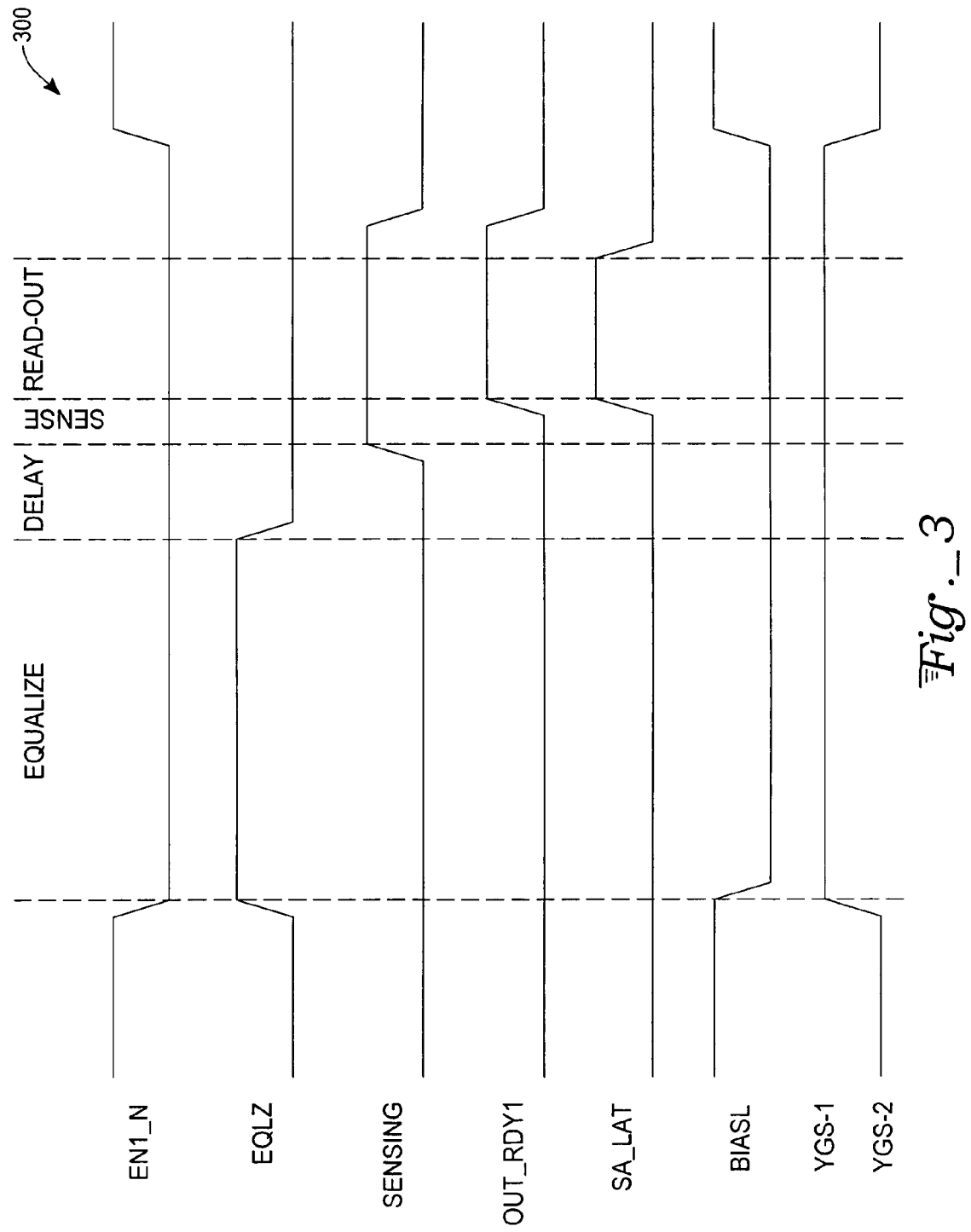
Fig._3

SENSE AMPLIFIER FOR FLASH MEMORY DEVICE

TECHNICAL FIELD

The present invention is related to integrated circuits. More specifically, the present invention provides an improved apparatus for a latch-type sense amplifier with low power consumption, high speed of operation, and minimal area requirements for fabrication.

BACKGROUND ART

Sense amplifier circuits are employed in memory devices to read a content of memory cells and to provide an output signal indicative of a logical value stored in the cells. Both volatile (e.g., SRAM) and non-volatile (e.g., FLASH) memories employ sense amplifiers. One form of memory, termed FLASH memory, is particularly attractive for applications requiring non-volatile storage with large memory capacity and relatively low cost. The advancement of semiconductor technology has resulted in a continual improvement in the performance of all memory systems, and FLASH memory systems in particular, as measured by attributes such as power, storage capacity, speed, and cost. These performance attributes are favorably impacted by ongoing reductions in device feature size and operating voltage. As memory cell sizes decrease, the available sense current and voltage are reduced. Therefore, sense amplifier performance must improve.

What is needed, therefore, is a method for realizing a high performance sense amplifier which takes advantage of CMOS fabrication processes in order to provide low power consumption, high speed operation, high sensitivity, and low silicon area consumption.

SUMMARY OF THE INVENTION

The present invention is an apparatus and method for a sense amplifier circuit. The sense amplifier incorporates a cross-coupled latch circuit which attains high speed and sensitivity by equalizing all circuit nodes to a potential near a switching threshold of the inverters comprising the latch. Both the power supply nodes to the latch, as well as the signal nodes are equalized. When sensing the bitline signals, both power supply connections to the latch are uncoupled to allow the latch power supply node potentials to be equalized. The devices used to control the power supply connections to the latch are located in a separate sense amplifier control circuit, such that a single instance of the control circuit can service multiple instances of the sense amplifier, saving circuit area by avoiding duplication of power control devices.

The present invention further incorporates high voltage transistors to couple the memory bitlines to the latch circuit. The latch circuit, equalization transistors, readout devices, and reference current transistors comprising the sense amplifier are fabricated using minimum geometry, low voltage transistors, thereby saving power consumption and circuit area. The high voltage transistors enable the memory bitlines to carry substantially higher voltages, for example FLASH memory programming voltages, without damaging the remainder of the devices comprising the sense amplifier.

BRIEF DESCRIPTION OF THE DRAWINGS

FIG. 3 is a conceptual timing diagram for sense amplifier signals according to an exemplary embodiment of the present invention.

DETAILED DESCRIPTION OF THE INVENTION

In the discussions infra, it will be appreciated by those skilled in the art that MOSFET transistors are typically configured as symmetrical devices, and consequently an interchange of the terminals named source and drain has no effect on the operation of the device. In usual nomenclature, a conventional electrical current is presumed to flow into the source terminal of a PMOS transistor, and out from the source terminal of an NMOS transistor. However, certain applications render the terminology ambiguous. One example is a passgate which may experience current in both directions through the devices comprising the passgate. For this reason, although the terms source and drain are applied infra, it is to be understood that they are not intended as limiting with respect to the direction of current through a device. Rather, the direction of current is to be understood on the basis of the bias potentials applied to the device terminals.

Figure 1:
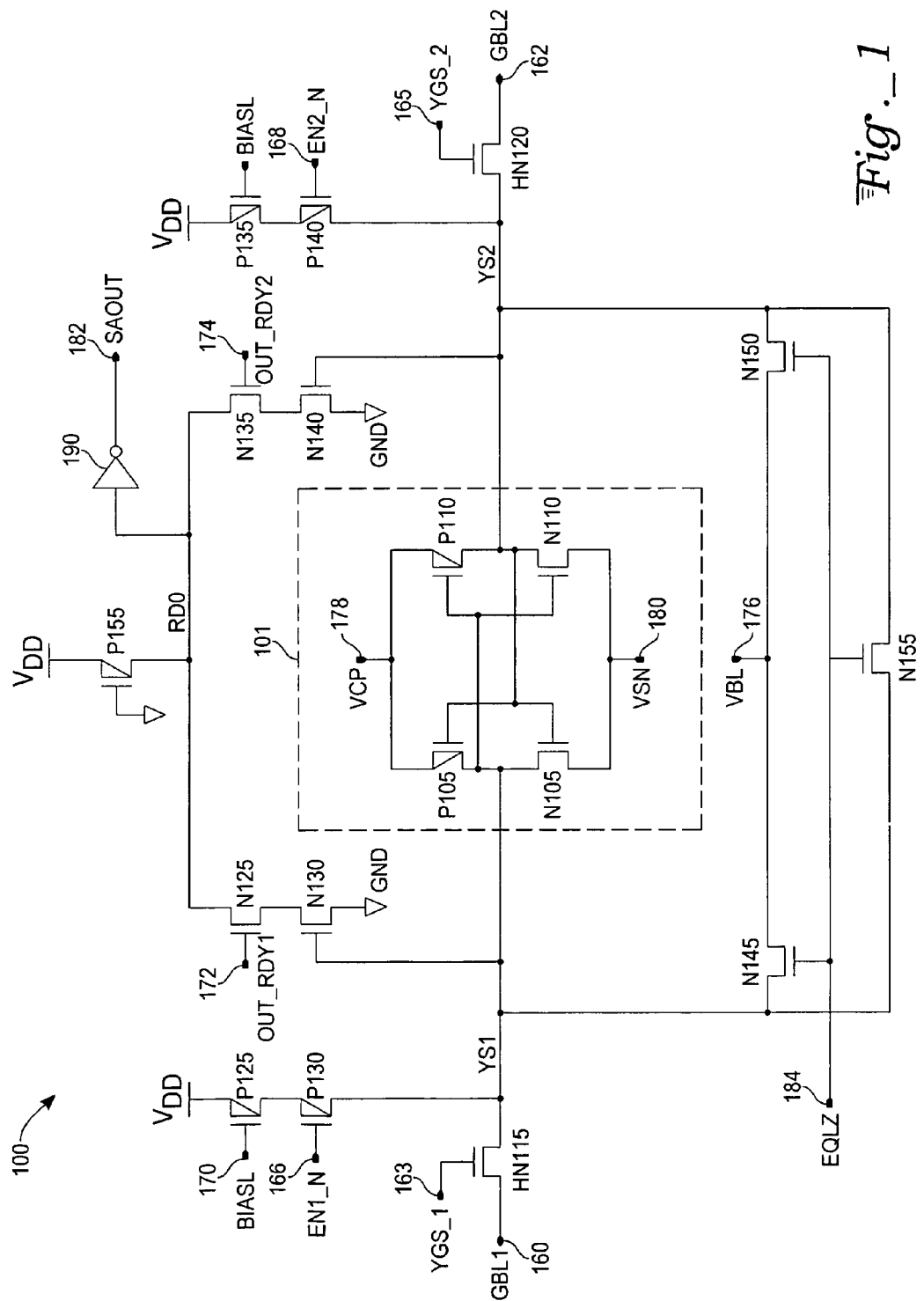
FIG. 1 is an exemplary circuit schematic of a sense amplifier circuit according to the present invention.

With reference to FIG. 1, sense amplifier circuit 100, in an exemplary embodiment of the present invention, comprises a cross-coupled latch 101 having PMOS transistors P105 and P110, NMOS transistors N105 and N110, a VCP supply node 178, and a VSN supply node 180. The source terminals of the PMOS transistors P105 and P110 are coupled to the VCP supply node 178. The source terminals of the NMOS transistors N105 and N110 are coupled to the VSN supply node 180. The drain terminals of the PMOS transistor P105 and the NMOS transistor N105 are coupled to each other, to the gate terminals of the PMOS transistor P110 and the NMOS transistor N110, and to a signal line YS1. The drain terminals of the PMOS transistor P110 and the NMOS transistor N110 are coupled to each other, to the gate terminals of the PMOS transistor P105 and the NMOS transistor N105, and to a signal line YS2. Those skilled in the art will recognize that the PMOS transistor P105 and the NMOS transistor N105 are configured as a CMOS inverter. Analogously, the PMOS transistor P110 and the NMOS transistor N110 are configured as a CMOS inverter.

The signal line YS1 is coupled to the drain terminal of a high voltage NMOS transistor HN115. The gate terminal of the high voltage NMOS transistor HN115 is coupled to a YGS_1 input node 163. The source terminal of the high voltage NMOS transistor HN115 is coupled to a GBL 1 bit line node 160. The signal line YS2 is coupled to the drain terminal of a high voltage NMOS transistor HN120. The gate terminal of the high voltage NMOS transistor HN120 is coupled to the YGS_2 input node 165. The source terminal of the high voltage NMOS transistor HN120 is coupled to a GBL 2 bit line node 162.

The signal line YS1 is further coupled to a PMOS transistor P130, and to NMOS transistors N130, N145, and N155. The signal line YS2 is further coupled to a PMOS transistor P140, to NMOS transistors N140, and N150, and to the NMOS transistor N155.

A PMOS transistor P125 has its source terminal coupled to a first power supply potential $V_{DD}$, its gate terminal coupled to a BIASL signal node 170, and its drain terminal coupled to the source terminal of the PMOS transistor P130. The gate terminal of the PMOS transistor P130 is coupled to an EN1_N signal node 166 and the source terminal of the PMOS transistor P130 is coupled to the signal line YS1. A PMOS transistor P135 has its source terminal coupled to the first power supply potential $V_{DD}$, its gate terminal coupled to the BIASL signal node 170, and its drain terminal coupled to the source terminal of the PMOS transistor P140. The gate terminal of the PMOS transistor P140 is coupled to an EN2_N signal node 168 and the source terminal of the PMOS transistor P140 is coupled to the signal line YS2.

The NMOS transistor N145 has its drain terminal coupled to the signal line YS1, its gate terminal coupled to an EQLZ signal node 184, and its source terminal coupled to a VBL supply node 176. The NMOS transistor N150 has its drain terminal coupled to the signal line YS2, its gate terminal coupled to the EQLZ signal node 184, and its source terminal coupled to the VBL supply node 176 and to the source terminal of the NMOS transistor N145.

A PMOS transistor P155 has its source terminal coupled to the first power supply potential $V_{DD}$, its gate terminal coupled to a second power supply potential GND, and its drain coupled to an input terminal of an inverter 190, to a signal line RDO, and to the drain terminals of NMOS transistors N125 and N135. The gate terminal of the NMOS transistor N125 is coupled to an OUT_RDY1 signal node 172. The NMOS transistor N130 has its drain terminal coupled to the source terminal of the NMOS transistor N125, its gate terminal coupled to the signal line YS1, and its source terminal coupled to the second power supply potential GND. The gate terminal of the NMOS transistor N135 is coupled to an OUT_RDY2 signal node 174. The NMOS transistor N140 has its drain terminal coupled to the source terminal of the NMOS transistor N135, its gate terminal coupled to the signal line YS2, and its source terminal coupled to the second power supply potential GND.

Figure 2:
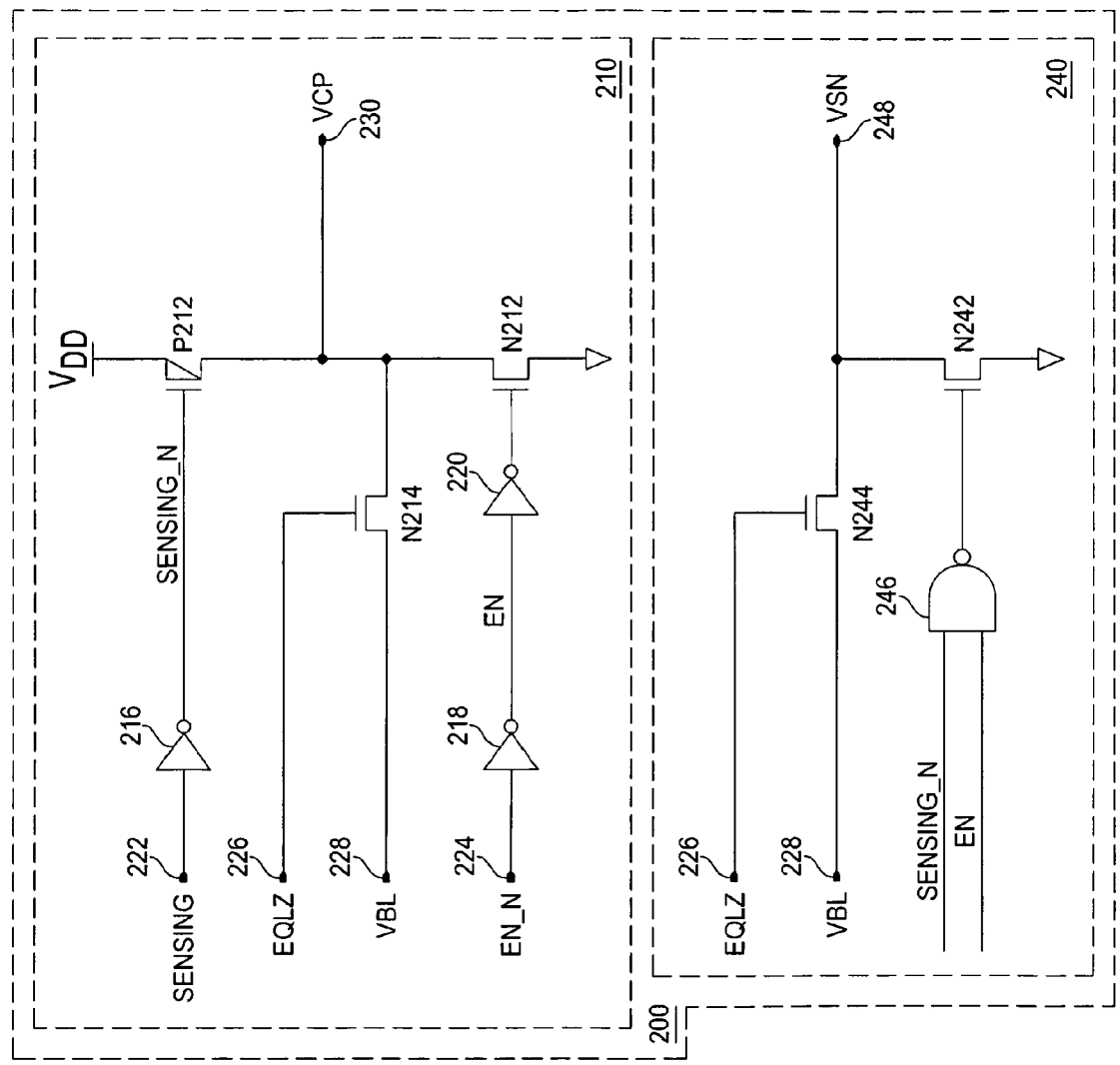
FIG. 2 is an exemplary circuit schematic of a sense amplifier control circuit according to the present invention.

With reference to FIG. 2, sense amplifier control circuitry 200 according to an exemplary embodiment of the present invention comprises a VCP control circuit 210 and a VSN control circuit 240. The VCP control circuit 210 further comprises a PMOS transistor P212 having a source terminal coupled to the first power supply potential $V_{DD}$, a gate terminal coupled to a SENSING_N signal line, and a drain terminal coupled to a VCP supply input/output node 230. A SENSING signal node 222 is coupled to an input terminal of an inverter 216. The output_terminal the inverter 216 is coupled to the SENSING_N signal line. An NMOS transistor N214 has its gate terminal coupled to EQLZ signal node 226, its drain terminal coupled to VBL supply node 228, and its source terminal coupled to the VCP supply input/output node 230. An EN_N signal input node 224 is coupled to an input terminal of an inverter 218. An output terminal of the inverter 218 is coupled to an EN signal line. The EN signal line is coupled to an input terminal of an inverter 220 and to a first input terminal of a NAND gate 246 (within the VSN control circuit 240). An NMOS transistor N212 has its drain terminal coupled to the VCP supply input/output node 230, its gate terminal coupled to an output terminal of the inverter 220, and its source terminal coupled to the second power supply potential GND.

The VSN control circuit 240 comprises NMOS transistor N244 having a gate terminal coupled to the EQLZ signal node 226, a drain terminal coupled to the VBL supply node 228, and a source terminal coupled to a VSN supply input/output node 248. An NMOS transistor N242 has its gate terminal coupled to an output terminal of the NAND gate 246, its drain terminal coupled to the VSN supply input/output node 248, and its source terminal coupled to the second power supply potential GND. The NAND gate 246 has a second input terminal coupled to the SENSING_N signal line.

The configuration of the sense amplifier control circuitry 200 is such that a single instantiation of the sense amplifier control circuitry 200 can couple to one or more instantiations of the sense amplifier 100. In this manner, transistors utilized to control power and bias connections to the sense amplifier 100 instantiations need not be unnecessarily duplicated, thereby saving valuable area on a substrate used to fabricate the sense amplifier 100. In an exemplary embodiment of the present invention, a single instantiation of the sense amplifier control circuitry is coupled to 64 instances of the sense amplifier 100, representing an advance over the prior art in which latch circuits directly incorporate extra transistors providing power control capability, e.g., latches comprised of tri-state capable inverters.

The operation of the sense amplifier 100 will now be discussed with reference to FIG. 3, a timing diagram 300 for the sense amplifier 100 signals according to an exemplary embodiment of the present invention. Timing diagram 300 comprises four modes of operation: equalize, delay, sense, and read-out. Timing diagram 300 further comprises signals EN1_N, EQLZ, SENSING, OUT1_RDY, and SA_LAT, BIASL, YGS_1, and YGS_2. The signal BIASL is an analog signal. Those skilled in the art will appreciate that analog signals can assume any potential within a continuum of values established by the operating limits of the circuit controlling the signal. Signals EN1_N, EQLZ, SENSING, OUT1_RDY, and SA_LAT, YGS_1, and YGS_2 are digital signals. Skilled artisans understand that digital signals assume essentially two potentials representing logical conditions high and low, known alternatively as 1 and 0, further known alternatively as true and false. The signals EN1_N, EQLZ, SENSING, OUT1_RDY, and SA_LAT, BIASL, YGS_1, and YGS_2 will be explained further, infra. In an exemplary embodiment of the present invention for reading a memory core cell coupled to the GBL 1 bit line node 160, a digital signal EN2_N is held at a logic high and a digital signal OUT_RDY2 is held at a logic low during operation of the sense amplifier circuit 100. In operation of the sense amplifier 100, one of the signal EN1_N and the signal EN2_N will be applied to the EN_N signal input node 224 (FIG. 2), depending upon which side of the sense amplifier is being used for reading. In the exemplary embodiment of the present invention for reading a memory core cell coupled to the GBL 1 bit line node 160, the signal EN1N will be applied to the EN_N signal input node 224.

Equalize Mode

In addition to preparing the sense amplifier for subsequent operating modes, the equalize mode is used to initialize the sense amplifier circuit 100 operation, acting as a reset state, for example, following a power-up.

Referring again to FIGS. 1 and 3, during the equalize mode, control signal EQLZ and the EQLZ signal node 184 are placed into a logic high condition, biasing the NMOS transistors N145, N150, and N155 into conduction. The NMOS transistors N145 and N150 couple the VBL supply node 176 to the signal lines YS1 and YS2. The VBL supply node 176 is held at an equalization potential VBL close to a logic transition threshold of the cross-coupled latch 101. Those skilled in the art will recognize that the equalization potential typically is approximately one-half of the difference between the first power supply potential $V_{DD}$ and the second power supply potential GND. Furthermore, methods of achieving a potential suitable for use as an equalization potential are known to skilled artisans. The NMOS transistor N155 serves to further couple the signal lines YS1 and YS2, ensuring that these signal lines rapidly equilibrate to a substantially equal potential.

Referring back to FIG. 2, EQLZ signal node 226 is placed into a logic high condition, biasing the NMOS transistors N214 and N244 into conduction. The NMOS transistors N214 and N244 couple the VBL supply node 228, held at the equalization potential VBL, to the VCP supply input/output node 230 and to the VSN supply input/output node 248. The VCP supply input/output node 230 couples the equalization potential to the VCP supply node 178 (FIG. 1). The VSN supply input/output node 248 couples the equalization potential to the VSN supply node 180 (FIG. 1).

The result of the EQLZ signal action in the logic high condition as explained supra is to bring all circuit nodes of the cross-coupled latch 101 to a substantially equal potential close to the logic threshold of the cross-coupled latch. As a result, the latch is able to change logic states rapidly according to the addition or subtraction of charge via one or both bitline connections, to be explained infra.

Referring again to FIG. 3, the signals EN1_N, SENSING, OUT_RDY, and SA_LAT are held at logic low during the equalize mode. Attention is again directed to FIG. 2: the application of a logic low by signal EN1_N to the EN_N signal input node 224 and a logic low by signal SENSING, after propagating through the intervening logic, causes PMOS transistor P212, NMOS transistor N212, and NMOS transistor N242 to be biased off. Consequently, PMOS transistor P212, NMOS transistor N212, and NMOS transistor N242 have no appreciable effect on the potential of the VCP supply input/output node 230 and the VSN supply input/output node 248, allowing propagation of the equalization potential as described supra.

The OUT_RDY1 signal is applied to the OUT_RDY1 signal node 172 (FIG. 1) biasing the NMOS transistor N125 off. The OUT_RDY2 signal is applied to the OUT_RDY2 signal node 174 (FIG. 1), biasing the NMOS transistor N135 off. The off condition of the NMOS transistors N125 and N135 decouples the readout signal line RDO (FIG. 1) from the influence of the NMOS transistors N130 and N140. The PMOS transistor P155 causes a pull-up on the readout signal line RDO to substantially the first power supply $V_{DD}$, equivalent to a logic high condition.

The YGS_1 signal of FIG. 3 is coupled to the YGS_1 input node 163 and the YGS_2 signal of FIG. 3 is coupled to the YGS_2 input node 165. In an exemplary embodiment of the present invention, the sense amplifier circuit 100 is coupled to two equally sized memory core arrays. A first memory core array has memory core cells coupled to GBL 1 bit line node 160. A second memory core array has memory core cells coupled to GBL 2 bit line node 162. The logic high condition of the YGS_1 signal and the YGS_2 signal during the equalize mode causes the high voltage NMOS transistors HN115 and HN120 (FIG. 1) to be biased on. As a result the GBL 1 bit line node 160 and the GBL 2 bit line node 162 are coupled to the cross-coupled latch 101 and are biased to approximately the equalization potential VBL during the equalize mode.

A novel feature of the present invention is the use of high voltage transistors HN115 and HN120 to decouple the bit lines from the cross-coupled latch. In the context of the present invention, the term high voltage transistor means any bit line transistor capable of withstanding and controlling substantially higher operating potentials than the transistors comprising the remainder of the sense amplifier 100. The high voltage transistors enable the bit lines to carry, for example, the elevated potentials required during FLASH memory cell programming.

Referring again to FIG. 1, a constant bias potential is applied to the BIASL signal node 170, biasing PMOS transistors P125 and P135 into conduction. The potential applied to the BIASL signal node 170 is selected by a reference circuit on the basis of an anticipated current appropriate to an array block which is selected for a read operation. By adjustment of the constant bias potential, using methods known to those skilled in the art, the PMOS transistors P125 and P135 may be configured to provide a controlled current source. In an exemplary embodiment of the present invention, the reference potential is substantially constant.

In the exemplary embodiment of the present invention for reading a memory core cell coupled to the GBL 1 bit line node 160, the signal EN1_N is biased at logic low during the equalize mode (FIG. 3), biasing PMOS transistor P130 into conduction. This provides a path for a reference current coupled from the first power supply voltage $V_{DD}$ through the PMOS transistor P125. However, the current drive capability provided through the VBL supply node 176 is sufficient to overcome any current sourced through the PMOS transistor P130 and the PMOS transistor P140. Furthermore, the NMOS transistor N155 strongly couples the signal line YS1 to the signal line YS2. The result is that during the equalization mode, the GBL 1 bit line node 160, the GBL bit line node 162, the signal line YS1, the signal line YS2, the VCP supply node 178, and the VSN supply node 180 will all achieve a potential approximately equal to the equalization potential VBL during the interval in which the equalize signal EQLZ is at logic high.

Delay Mode

Again referring to FIG. 3, during the delay mode, signal EQLZ transitions to a logic low value. This biases the NMOS transistors N145, N150, and N155 off (FIG. 1), decoupling the equalization potential (provided by the VBL supply node 176) from the signal nodes YS1 and YS2. Referring to FIG. 2, the logic low condition of the EQLZ signal causes the NMOS transistors N214 and N244 to be biased off, decoupling the equalization potential VBL (provided by the VBL supply node 228) from the VCP supply input/output node 230 and from the VSN supply input/output node 248. Thus, the VCP supply node 178 and the VSN supply node 180 of the cross-coupled latch 101 (FIG. 1) are essentially floated.

In the exemplary embodiment of the present invention for reading a memory core cell coupled to the GBL 1 bit line node 160, the signal line YS2 has no current drive, except for an intrinsic capacitance on the GBL 2 bit line node 162. The signal line YS1 begins to develop a differential voltage, referenced to the equalization potential VBL, which depends on the strength of the reference current provided through the PMOS transistor P130 and on the strength of the current from the memory core cell. If the core cell is programmed to an "off" state, minimal current will be present at the GBL 1 bit line node 160. As a result, the reference current will pull the signal line YS1 higher in potential than the equalization potential VBL through the PMOS transistor P130. In the exemplary embodiment of the present invention, the core cell programmed to an "on" state has approximately twice the current drive capability of the reference current. If the core cell is programmed to an "on" state, the signal line YS1 will be pulled lower in potential than the equalization potential VBL. The result is a differential potential developed between the signal line YS1 and the signal line YS2 prior to entering the sense mode.

Sense Mode

In the sense mode, the SENSING signal (FIG. 3) transitions to logic high. The combination of a logic high SENS- ING signal and a logic low EN1_N signal places the sense amplifier control circuitry 200 in a configuration coupling the first power supply potential $V_{DD}$ to the VCP supply input/output node 230 and the second power supply potential GND to the VSN supply input/output node 248. This applies operating power to the cross-coupled latch 101. The inputs of the cross-coupled latch, the signal line YS1 and the signal line YS2, have been pre-set in the delay mode. Therefore, the output levels of the cross-coupled latch 101 will track the inputs when operating power is applied. For example, assume the signal line YS1 is at a potential slightly above the potential of the signal line YS2 at the conclusion of the delay mode. During the sense mode, the signal line YS1 will resolve to a logic high, while the signal line YS2 will resolve to a logic low.

A sufficient time interval is allocated to the sense mode to allow the potentials on the signal lines YS1 and YS2 to fully stabilize. Fully stabilized, a logic high is approximately the same as the first power supply potential $V_{DD}$ and a logic low is approximately the second power supply potential GND. It is to be appreciated that the potentials present on the bit line nodes need only be sufficient to upset the balance of the equilibrated cross-coupled inverter to cause a rapid change of state to the final resolved condition. In this way, the sensitivity and speed of the sense amplifier 100 are improved.

Read-Out Mode

In the read-out mode, one of the first output ready signal OUT_RDY1 and the second output ready signal OUT_RDY2 are set to a logic high condition, depending on which side of the memory array is to be read. In the exemplary embodiment of the present invention for reading a memory core cell coupled to the GBL 1 bit line node 160, the first output ready signal OUT_RDY1 is set to a logic high condition.

Referring again to FIG. 3, in the read-out mode, signal OUT_RDY1 transitions to logic high. The OUT_RDY2 signal node 174 is held at logic low. Consequently, the NMOS transistor 135 is biased off, and the NMOS transistors N135 and N140 can be ignored. The NMOS transistor N125 is biased into conduction coupling the signal line RDO to the signal line YS1 by the NMOS transistor N130 such that the logical state of the signal line RDO is the complement of the logical state of the signal line YS1. The logical state of the signal line RDO is complemented by the inverter 190, producing an output on the SAOUT signal output node 182 which matches the logical state of the signal line YS1.

The NMOS transistors N125, N130, N135, and N140 are sized to enable them, when biased into conduction, to pull the signal line RDO to approximately the second power supply potential GND, overcoming the tendency of the PMOS transistor P155 to maintain the signal line RDO at the first power supply potential $V_{DD}$. Those skilled in the art will appreciate that the inherent capability of NMOS devices to conduct current makes them preferable to employ in a pull-down configuration as described supra, and that such a pull-down configuration is desirable to achieve high speed operation.

The SA_LAT signal can be used to control a latch coupled to the SAOUT signal output node 182 to capture the output on the SAOUT signal output node 182. When the SA_LAT signal transitions to logic high, the latch will capture the output. When SA_LAT reverts to logic low, the output is latched. Once the output is latched, the sense amplifier circuit 100 may optionally be turned off to save power.

Subsequent to SA_LAT transitioning to logic low, the signal OUT1_RDY and the signal SENSING will transition to logic low, and the signal EN1_N will transition to logic high, preparing the sense amplifier circuit 100 for the next read cycle.

Again referring to FIGS. 1 and 3, following completion of the read-out mode, the signals SENSING and OUT_RDY transition to a logic low, and the signal EN_N transitions to a logic high (FIG. 3). In this condition, the PMOS transistor P130, the PMOS transistor P140 and the high voltage NMOS transistors HN115 and HN120 are biased off. The signal EQLZ remains at a logic low, maintaining the NMOS transistors N145, N150, and N150 in a biased off condition. The NMOS transistors N212 and N242 within the sense amplifier control circuitry 200 (FIG. 2) are biased into conduction, coupling both the VCP supply input/output node (230) and the VSN supply input/output node 248 to the second power supply potential GND. As a result, the signal lines YS1 and YS2 are biased to the second power supply potential GND. The signal line RDO is returned to a logic high condition by the PMOS transistor P155. The cross-coupled inverter 101 is now ready to begin a new equalize mode.

The present invention provides different methods of interfacing the sense amplifier 100 to a memory array. In one embodiment, only one of either GBL 1 bit line node 160 and GBL 2 bit line node 162 is coupled to a bit line. The unconnected node is utilized as a reference node, enabling the sense amplifier 100 to operate in a non-differential manner, utilizing a single-ended input. In an additional embodiment, GBL 1 bit line node 160 and GBL 2 bit line node 162 are each coupled to separate bit lines, enabling a single instance of the sense amplifier 100 to service two distinct memory arrays. By directing the logic high SENSING signal, to either one of YGS_1 input node 163 and YGS_2 input node 165, the bit line to be read is selected. In yet another embodiment of the present invention, the sense amplifier 100 can be utilized in a differential mode in which GBL1 bit line node 160 is coupled to a bit line signal and GBL 2 bit line node 162 is coupled to the logical complement of the bit line signal.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, although the present invention has been described in the context of application to FLASH memory, skilled artisans will readily appreciate that the present invention may be utilized with a variety of memory types. In addition, the present invention may be employed as a differential amplifier or in a configuration enabling two distinct bit lines to be sensed. The specification and drawings are, accordingly, to be regarded in an illustrative rather than a restrictive sense.

What is claimed is:

1. A method for a latch circuit within a sense amplifier, the method comprising:

coupling a first latch supply node and a second latch supply node in the latch circuit to an equalization potential during an equalization mode, wherein the equalization potential is approximately equal to a logic threshold of the latch circuit;

providing a reference current to a selected one of first and second signal nodes in the latch circuit so as to develop a potential on the selected signal node corresponding to a state of a bitline;

coupling the first latch supply node to a first power supply potential and the second latch supply node to a second power supply potential during a sense mode; and coupling the first latch supply node to the first power supply potential and the second latch supply node to the second power supply potential during a read-out mode.

2. A method for a latch circuit within a sense amplifier, the method comprising:
coupling a first latch supply node and a second latch supply node in the latch circuit to an equalization potential during an equalization mode;
coupling the first latch supply node to a first power supply potential and the second latch supply node to a second power supply potential during a sense mode;
coupling the first latch supply node to the first power supply potential and the second latch supply node to the second power supply potential during a read-out mode; and
latching a data output of the sense amplifier and then floating the first latch supply node and the second latch supply node such that the latch uses substantially no power.

3. A sense amplifier circuit comprising:
a latch circuit having a first signal node, a second signal node, a first latch power supply node and a second latch power supply node;
an equalization circuit to couple an equalization potential to the first signal node, the second signal node, the first latch power supply node, and the second latch power supply node when the sense amplifier circuit is operating in an equalization mode;
a sense circuit to couple the first latch power supply node to a first power supply potential and the second latch power supply node to a second power supply potential during a sense mode, the sense circuit to couple the first signal node to a first bitline signal and the second signal node to one of a second bitline signal, a complement of the first bitline signal, and a reference signal during a sense mode;
a power supply circuit to couple the first power supply potential to the first latch power supply node and the second power supply potential to the second latch power supply node when the sense amplifier is operating in a read-out mode;
a read-out circuit to output an output signal coupled to one of the first signal node and the second signal node during the read-out mode; and
a high voltage switch to substantially preclude conduction between the first bitline signal and the first signal node, and the second bitline signal and the second signal node during a programming operation, the programming operation to produce on at least one of the first bitline signal and the second bitline signal a potential substantially exceeding a voltage range defined by the first power supply potential and the second power supply potential.

4. A sense amplifier circuit, comprising:
a latch formed by a pair of cross-coupled inverters and having a first signal node, a second signal node, a first latch power supply node and a second latch power supply node;
control circuitry, including an equalization circuit, responsive to an equalization control signal, configured to couple the first and second signal nodes together to an equalization potential that is close to a threshold of the latch and to isolate the first and second latch power supply nodes from respective first and second power supply potentials and couple the same to the equalization potential whenever the sense amplifier circuit is operating in an equalization mode;
a pair of bitline transistors configured to couple a selected one of first and second memory bitlines to a respective one of the first and second signal nodes of the latch;
a pair of reference current circuits coupled to respective signal nodes of the latch and responsive to control signals, to provide a reference current to a selected one of the first and second signal nodes in a delay mode of the sense amplifier circuit so as to develop a potential on the selected first or second signal node corresponding to a state of a selected memory cell on the selected memory bitline, the first and second latch power supply nodes remaining isolated from the respective first and second power supply potentials during the delay mode, the control circuitry, responsive to a sense control signal, to couple the first and second latch power supply nodes to the respective first and second power supply potentials in a sense mode at the conclusion of the delay mode such that the developed potential causes the latch to assume a state corresponding to the selected memory cell; and
a readout circuit coupled to the first and second signal nodes of the latch so as to produce an output signal during a read-out mode from that one of the first and second signal nodes corresponding to the selected memory bitline.

5. The sense amplifier circuit of claim 4, wherein the pair of bitline transistors are high voltage transistors to substantially preclude conduction between the memory bitlines and the first and second signal nodes of the latch during a programming operation.

6. The sense amplifier circuit of claim 4, wherein the equalization potential is approximately midway between the first and second power supply potentials.

7. The sense amplifier circuit of claim 4, wherein the control signals for the reference current circuits include a bias signal and a pair of enable control signals coupled to the respective reference current circuits.

8. The sense amplifier circuit of claim 4, wherein the signal node of the latch to which a reference current is provided is that coupled to the selected bitline.

9. A method of operating a sense amplifier latch circuit, comprising: in an equalization mode, isolating first and second latch power supply nodes of a latch from respective first and second power supply potentials, and coupling the first and second latch power supply nodes as well as first and second signal nodes of the latch to an equalization potential that is close to a threshold of the latch;
in a delay mode, continuing to isolate the first and second latch power supply nodes from the respective first and second power supply potentials, while coupling a selected one of first and second memory bitlines to a respective one of the first and second signal nodes and providing a reference current to a selected one of the first and second signal nodes so as to develop a potential on the selected signal node corresponding to a state of a selected memory cell on the selected memory bitline;
in a sense mode, coupling the first and second latch power supply nodes to the respective first and second power supply potentials such that the potential developed on the selected signal node causes the latch to assume a state corresponding to the state of the selected memory cell on the selected memory bitline; and
in a read-out mode, coupling a read-out circuit to the first signal node or the second signal node so as to produce an output signal corresponding to the state of the latch.

10. The method of claim 1, further comprising latching a data output of the sense amplifier and then floating the first latch supply node and the second latch supply node such that the latch circuit uses substantially no power.

11. The method of claim 1, further comprising substantially precluding conduction between bitlines and the first and second signal nodes with a pair of high voltage transistors during a programming operation.

12. The method of claim 1, further comprising coupling a read-out circuit to a selected one of the first and second signal nodes so as to produce an output signal corresponding to a state of the latch circuit.

13. The method of claim 1, wherein the equalization potential is approximately midway between the first and second power supply potentials.

14. The method of claim 2, further comprising providing a reference current to a selected one of first and second signal nodes in the latch circuit so as to develop a potential on the selected signal node corresponding to a state of a bitline.

15. The method of claim 2, further comprising substantially precluding conduction between bitlines and first and second signal nodes in the latch circuit with a pair of high voltage transistors during a programming operation.

16. The method of claim 2, further comprising coupling a read-out circuit to a selected one of first and second signal nodes in the latch circuit so as to produce an output signal corresponding to a state of the latch circuit.

17. The method of claim 2, wherein the equalization potential is approximately midway between the first and second power supply potentials.

18. The sense amplifier circuit of claim 3, wherein the high voltage switch includes one or more high voltage transistors.

19. The sense amplifier circuit of claim 3, further comprising a pair of reference current circuits coupled to the respective first and second signal nodes of the latch circuit and responsive to control signals, to provide a reference current to a selected one of the first and second signal nodes in a delay mode so as to develop a potential on the selected signal node corresponding to a state of a bitline.

20. The sense amplifier circuit of claim 3, wherein the equalization potential is approximately midway between the first and second power supply potentials.

21. The method of claim 9, further comprising providing a reference current to a selected one of the first and second signal nodes so as to develop a potential on the selected signal node corresponding to a state of the selected memory bitline.

22. The method of claim 9, further comprising substantially precluding conduction between the memory bitlines and the first and second signal nodes with one or more high voltage transistors during a programming operation.

23. The method of claim 9, wherein the equalization potential is approximately midway between the first and second power supply potentials.

* * * * *